(12) United States Patent
Waight et al.

(10) Patent No.: US 10,284,277 B2
(45) Date of Patent: May 7, 2019

(54) REMOTE TUNER CLOCK DISTRIBUTION USING SERIALIZER/DESERIALIZER TECHNOLOGY

(71) Applicant: Maxim Integrated Products, Inc., San Jose, CA (US)

(72) Inventors: Matthew Waight, Pipersville, PA (US); Alexei Shatalov, Beaverton, OR (US); Adam Heiberg, Portland, OR (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 15/684,016

(22) Filed: Aug. 23, 2017

(65) Prior Publication Data

US 2018/0062726 A1   Mar. 1, 2018

Related U.S. Application Data

(60) Provisional application No. 62/379,842, filed on Aug. 26, 2016, provisional application No. 62/507,536, filed on May 17, 2017.

(51) Int. Cl.
| | | |
|---|---|---|
| *H03K 9/00* | (2006.01) | |
| *H04B 7/08* | (2006.01) | |
| *H04L 7/033* | (2006.01) | |
| *H04L 27/00* | (2006.01) | |

(Continued)

(52) U.S. Cl.
CPC .............. *H04B 7/08* (2013.01); *H04L 7/0331* (2013.01); *H04L 27/0014* (2013.01); *H03L 7/0807* (2013.01); *H04B 7/02* (2013.01); *H04L 2027/0024* (2013.01); *H04L 2027/0036* (2013.01)

(58) Field of Classification Search
CPC .. H04B 7/08; H04B 7/02; H04L 27/00; H04L 7/0331; H03L 7/0807
USPC ....... 375/316, 130, 259, 267, 260, 326, 295, 375/276; 370/276, 300, 476; 455/333
See application file for complete search history.

(56) References Cited

U.S. PATENT DOCUMENTS

| | | |
|---|---|---|
| 6,081,572 A | 6/2000 | Filip |
| 8,368,436 B1 | 2/2013 | Chu |
| 8,488,567 B2 | 7/2013 | Wu et al. |

(Continued)

FOREIGN PATENT DOCUMENTS

WO   2008075852 A1   6/2008

*Primary Examiner* — Dhaval V Patel
(74) *Attorney, Agent, or Firm* — Kevin E. West; Advent, LLP

(57) ABSTRACT

A communication system includes a first radio module and a second radio module. The first radio module includes a tuner communicatively coupled to a reference signal generator that is configured to generate a first reference signal for the tuner. The first radio module further includes a serializer configured to serialize a signal output by the tuner. The second radio module includes a deserializer configured to receive a serialized version of the signal from the serializer of the first radio module and deserialize the serialized version of the signal. The second radio module further includes a second tuner that is communicatively coupled to a clock recovery circuit. The clock recovery circuit is configured to generate a second reference signal for the second tuner based on a deserialized version of the first signal, where the second reference signal is frequency and phase locked to the first reference signal.

17 Claims, 2 Drawing Sheets

(51) Int. Cl.
   *H03L 7/08*     (2006.01)
   *H04B 7/02*     (2018.01)

(56) References Cited

U.S. PATENT DOCUMENTS

| | | |
|---|---|---|
| 8,532,200 B1 | 9/2013 | Wang et al. |
| 8,780,939 B2 | 7/2014 | Bafra et al. |
| 8,817,841 B2 | 8/2014 | Bafra et al. |
| 9,077,348 B1 | 7/2015 | Liu |
| 9,584,209 B2 | 2/2017 | Kianush et al. |
| 9,791,574 B2 * | 10/2017 | Leclercq ............. G01S 19/46 |
| 2011/0038428 A1 * | 2/2011 | Fukuda ............. H03M 5/20 375/259 |
| 2011/0103404 A1 * | 5/2011 | Bafra ............. H04L 1/0084 370/476 |
| 2012/0162233 A1 * | 6/2012 | Hidaka ............. H03M 9/00 345/501 |
| 2017/0126344 A1 * | 5/2017 | Park ............. H04J 3/0641 |

* cited by examiner

REMOTE TUNER CLOCK DISTRIBUTION USING SERIALIZER/DESERIALIZER TECHNOLOGY

CROSS-REFERENCE TO RELATED APPLICATIONS

The present application claims the benefit under 35 U.S.C. § 119(e) of U.S. Provisional Application Ser. No. 62/379,842, filed Aug. 26, 2016, and titled "REMOTE TUNER CLOCK DISTRIBUTION USING SERIALIZER/DESERIALIZER TECHNOLOGY," which is incorporated herein by reference in its entirety. The present application also claims the benefit under 35 U.S.C. § 119(e) of U.S. Provisional Application Ser. No. 62/507,536, filed May 17, 2017, and titled "REMOTE TUNER CLOCK DISTRIBUTION USING SERIALIZER/DESERIALIZER TECHNOLOGY," which is incorporated herein by reference in its entirety.

BACKGROUND

Communication systems can employ diversity reception schemes to improve signal reliability by utilizing multiple communication channels having different respective channel characteristics. Examples of channel diversity include, but are not limited to, time diversity, frequency diversity, space diversity, polarization diversity, multi-user diversity, cooperative diversity, combinations thereof, and so forth. Diversity reception is often performed by two or more tuners that are co-located so that they can run off the same frequency reference. For example, FM diversity solutions have tuners and baseband demodulators located within a head unit (e.g., a vehicular head unit) or in a remote radio module (e.g., a radio module located near a respective antenna or set of antennas). Tuners may be located near their respective antennas to reduce signal loss when the signal is transmitted from the antennas to the tuners and/or to reduce the number or length of cables needed to for connections between the tuners and their respective antennas. However, in diversity reception schemes it may be desirable to locate antennas at different positions to provide space diversity and/or prevent interference amongst the antennas. In these situations, disposing the tuners near their respective antennas requires each radio module for each antenna or set of antennas to have its own frequency reference (e.g., its own clock signal). Diversity reception using separate frequency references (e.g., separate clocks) for each radio module can be unreliable due to crystal frequency errors, and digital feedback techniques for clock synchronization are complicated and prone to start-up issues. Consequently, there is a need for diversity reception schemes that can operate multiple radio modules at a same or substantially same frequency reference (e.g., using a same or substantially same clock signal).

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Overview

Figure 1:
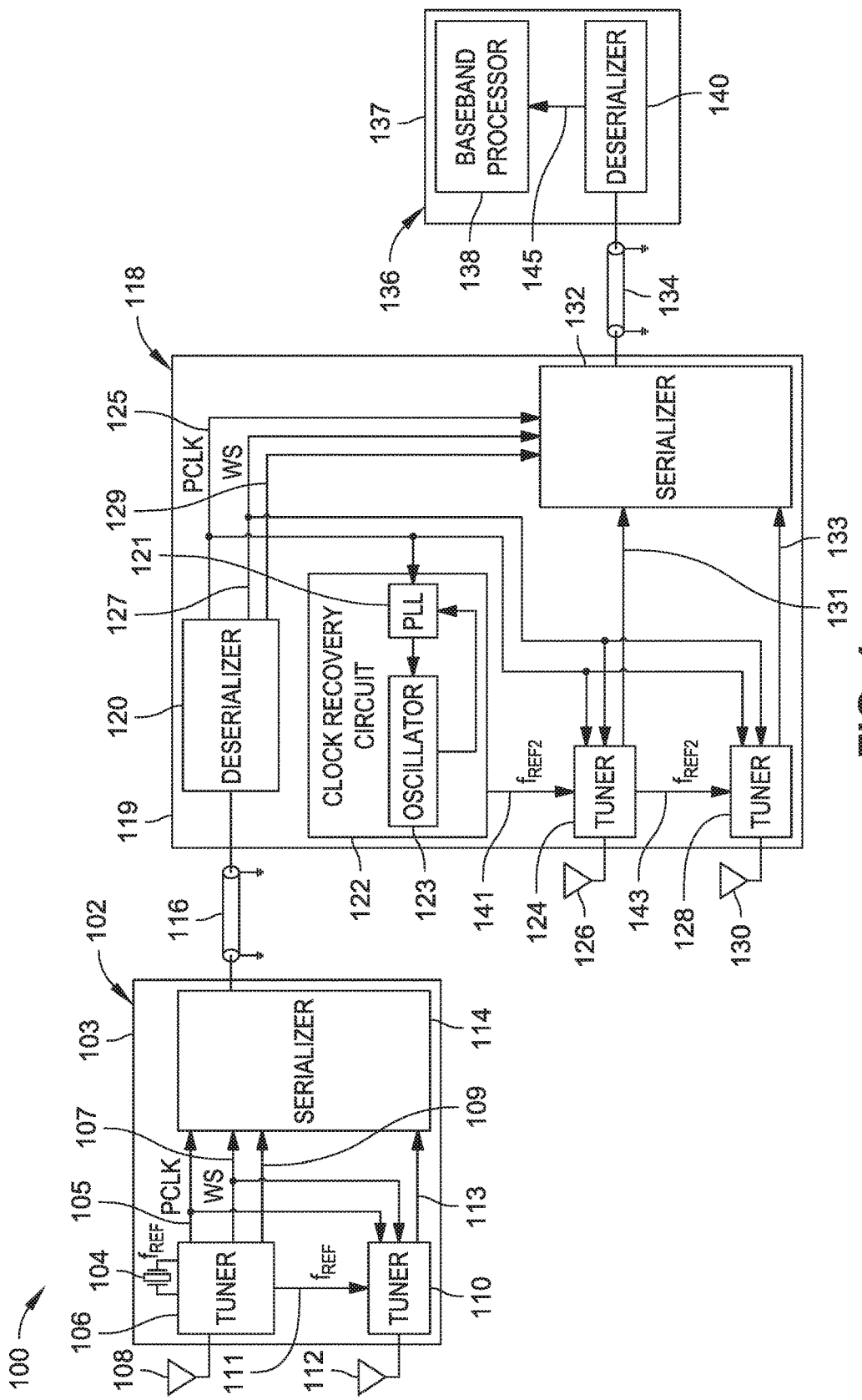
FIG. 1 is a block diagram illustrating a communication system with a diversity reception scheme that employs serializer/deserializer technology to provide a reference signal from a first radio module to a second radio module, in accordance with an example embodiment of the present disclosure.

Diversity reception schemes are employed in communication systems to improve signal reliability. For example, diversity reception schemes can be implemented in communication systems, including, but not limited to, radio communication systems, telecommunication systems, security systems, sound systems, television broadcasting systems, internet broadcasting systems, sensor systems, control systems, power distribution networks, and the like. Diversity reception schemes improve signal reliability by employing multiple communication channels having different respective channel characteristics. Examples of channel diversity include, but are not limited to, time diversity, frequency diversity, space diversity, polarization diversity, multi-user diversity, cooperative diversity, combinations thereof, and so forth.

Diversity reception schemes often employ multiple antennas, wherein a signal from each antenna is buffered and sent over a respective cable (e.g., coaxial cable) to a head unit where at least one tuner receives the signal from the antenna. Tuners may be located near their respective antennas to reduce signal loss when the signal is transmitted from the antennas to the tuners and/or to reduce the number or length of cables needed to for connections between the tuners and their respective antennas. However, as discussed above, diversity reception schemes often employ antennas at different positions (e.g., to provide space diversity and/or prevent interference amongst the antennas). Disposing the tuners near their respective antennas requires each radio module to have its own frequency reference (e.g., its own reference signal generator). However, diversity reception schemes that employ separate frequency references (e.g., separate reference signal generators) for each radio module can be unreliable due to crystal frequency errors.

A diversity reception scheme for a communication system is disclosed. In an implementation, the communication system includes two or more radio modules (e.g., at least a first radio module and a second radio module) that may be physically separate and/or remotely located from one another. The first radio module includes at least one tuner communicatively coupled to a reference signal generator that is configured to generate a first reference signal for the tuner. The first radio module further includes a serializer configured to serialize a signal output by the tuner. The second radio module includes a deserializer configured to receive a serialized version of the signal from the serializer of the first radio module and deserialize the serialized version of the signal. The second radio module further includes at least one (second) tuner that is communicatively coupled to a clock recovery circuit. The clock recovery circuit is configured to generate a second reference signal for the second tuner based on a deserialized version of the first signal, where the second reference signal is frequency and phase locked to the first reference signal. The deserializer provides a low-jitter output that can be processed by the clock recovery circuit to generate a second reference signal for the second radio module. In this manner, the system can provide robust diversity reception by providing a frequency reference (e.g., the second reference signal) for one or more tuners in the second radio module that is frequency and phase locked to the frequency reference (e.g., crystal or other reference signal generator) of the first radio module.

Example Implementations

FIG. 1 is a block diagram illustrating a communication system 100 in accordance with an example embodiment of this disclosure. In embodiments, the communication system 100 includes, but is not limited to, radio communication systems, telecommunication systems, security systems, sound systems, television broadcasting systems, internet broadcasting systems, sensor systems, control systems, power distribution networks, or the like. The communication system 100 includes at least two radio modules (e.g., at least a first radio module 102 and a second radio module 118) that may be physically separate and/or remotely located from one another. For example, the first radio module 102 and the second radio module 118 can have respective enclosures (e.g., enclosure 103 and enclosure 119) that define a physical boundary for some or all of the respective components of the first radio module 102 and the second radio module 118. The first radio module 102 and the second radio module 118 are configured to provide multiple communication channels for a diversity reception scheme. Examples of channel diversity implemented by the first radio module 102 and the second radio module 118 can include, but are not limited to, time diversity (e.g., where multiple versions of a signal are transmitted at different time instants), frequency diversity (e.g., where a signal is transmitted at several broadcast frequencies), space diversity (e.g., where a signal is transmitted over several propagation paths), polarization diversity (e.g., where multiple versions of a signal are transmitted with antennas having different respective polarization characteristics), multi-user diversity, cooperative diversity, combinations thereof, and so forth.

The communication channels implemented by the first radio module 102 and the second radio module 118 include a plurality of broadcast channels received by respective antennas of the first radio module 102 and the second radio module 118. In some embodiments, the plurality of broadcast channels include a plurality of different broadcast channels. For example, the plurality of different broadcast channels can include different terrestrial broadcast channels, different geo-positioning signals, different satellite broadcast channels, or the like. The plurality of different broadcast channels may include a combination of different channel types. For example, the plurality of different broadcast channels can include a combination of a terrestrial broadcast channel and a geo-positioning signal, a combination of a terrestrial broadcast channel and a satellite broadcast channel, a combination of a satellite broadcast channel and a geo-positioning signal, a terrestrial broadcast channel, a combination of a satellite broadcast channel and a geo-positioning signal, or any other combination of different channel types. Examples of broadcast channels received by the respective antennas of the first radio module 102 and the second radio module 118 can include, but are not limited to, amplitude modulation (AM) channels, frequency modulation (FM) channels, digital audio broadcasting (DAB) channels, satellite radio channels, digital television (DTV) broadcasting channels, satellite television channels, global navigation satellite system (GNSS) signals, radio frequency (RF) communication signals, optical communication signals, cellular tower signals, microwave communication signals, and combinations thereof.

The first radio module 102 includes at least one tuner 106 having a respective antenna 108 communicatively coupled to the tuner 106. In some embodiments, the first radio module 102 also includes at least one additional tuner 110 that can also have respective antenna 112 communicatively coupled to the tuner 110. In some embodiments, two or more tuners (e.g., tuner 106 and tuner 110) can be communicatively coupled to a shared antenna (e.g., a shared multi-band antenna). The tuner 106 may be communicatively coupled to a reference signal generator 104 (e.g., a crystal oscillator (XO), temperature compensated crystal oscillator (TCXO), or the like). The reference signal generator 104 can generate a first reference signal ($f_{REF}$) for the tuner 106 and any other tuners (e.g., tuner 110) or other components (e.g., serializer 114) of the first radio module 102. The tuner 106 may communicate $f_{REF}$ to the tuner 110 via a communication link 111 (e.g., one or more wires, traces, etc.). In some embodiments, the communication link 111 is coupled to an output buffer of the tuner 106 that relays $f_{REF}$ or a buffered version of $f_{REF}$. In some embodiments, the tuner 106 outputs a clock signal (PCLK) based on the first reference signal for other tuners (e.g., tuner 110) or other components (e.g., serializer 114) of the first radio module 102. For example, tuner 106 may communicate PCLK to the tuner 110 and the serializer 114 via a communication link 105 (e.g., one or more wires, traces, etc.). The tuner 106 can also be configured to communicate a word select (WS) signal to the tuner 110 and the serializer 114 via a communication link 107 (e.g., one or more wires, traces, etc.). The WS signal may include a signal that toggles from a first state (e.g., high or "1") to a second state (e.g., low or "0"), or vice versa, to indicate transmission of a next data segment (e.g., next word) in a series of data segments having a transmission rate controlled according to $f_{REF}$ and/or PCLK. The tuners (e.g., tuner 106 and tuner 110) can also be configured to communicate data signals (e.g., broadcast signals) to the serializer 114 via data lines 109 and 113. In some embodiments, tuner 106 has at least two respective data lines 109, and tuner 110 has at least two respective data lines 113. However, in other embodiments, each of the tuners can have one respective data line, or any number of respective data lines.

The serializer 114 of the first radio module 102 is configured to serialize signals output by the one or more tuners (e.g., tuners 106 and/or 110) of the first radio module 102. In an embodiment, the serializer 114 is configured to serialize a first signal output by the tuner 106. It is noted that any reference to a "first" or "second" component or signal does not indicate any order unless otherwise stated. These terms are used herein to distinguish components, signals, and the like. The serializer 114 output is communicatively coupled to a cable 116 (e.g., a coaxial cable, a twisted pair cable, or the like). In some embodiments, the cable 116 includes a single cable (e.g., a single coaxial cable, a single twisted pair cable, or the like), where the serializer 114 is configured to serialize signals from one tuner (e.g., tuner 106 or tuner 110) or a plurality of tuners (e.g., tuner 106 and tuner 110) prior to transmission of the signals via cable 116. In some embodiments, the serializer 114 is configured to serialize a plurality of digitized channels from the plurality of tuners (e.g., tuner 106 and tuner 110) onto a single output for transmission via cable 116. The serializer 114 is configured to transmit a serialized version of the first signal to the second radio module 118. For example, the serializer 114 can be configured to transmit the serialized version of the first signal via cable 116.

The second radio module 118 includes a deserializer 120 that is configured to receive the serialized versions of the signals transmitted by the serializer 114 from tuners (e.g., tuner 106 and/or tuner 110) in the first radio module 102. For example, the deserializer 120 is configured to receive a serialized version of the first signal from the serializer 114. In an embodiment, the deserializer 120 is configured to receive the serialized version of the first signal from serializer 114 via cable 116. The deserializer 120 is configured to deserialize the serialized version of the first signal. In some embodiments, the first signal includes a serialized version of PCLK. For example, the deserializer 120 outputs a deserialized version of PCLK that can be communicated to various components (e.g., clock recovery circuit 122, tuner 124, tuner 128, serializer 132, etc.) of the second radio module 128 via a communications link 125 (e.g., one or more wires, traces, etc.). The deserializer 120 can also be configured to communicate a deserialized version of the WS signal to various components (e.g., clock recovery circuit 122, tuner 124, tuner 128, serializer 132, etc.) of the second radio module 128 via a communications link 127 (e.g., one or more wires, traces, etc.). The deserializer 120 can also be configured to communicate deserialized data signals (e.g., broadcast signals) from the first radio module 102 to a serializer 132 of the second radio module 118 via one or more data lines 129. In some embodiments, deserializer 120 has at least four respective data lines 129. However, in other embodiments, the deserializer 120 may have one respective data line, or any number of respective data lines.

The second radio module 118 includes a clock recovery circuit 122 communicatively coupled to the deserializer 120 via communication link 125. In some embodiments, the clock recovery circuit 122 includes a phase-locked loop (PLL) 121 and an oscillator 123 (e.g., a voltage-controlled oscillator (VCO), voltage-controlled crystal oscillator (VCXO), digitally controlled crystal oscillator (DCXO), or the like). Some or all of the components of the clock recovery circuit 122 may be realized as an integral part of the deserializer 120, and as a result a separate clock recovery circuit may not be required in all cases. The clock recovery circuit 122 is configured to generate a second reference signal ($f_{REF2}$) for the second radio module 118 based on a deserialized version of the first signal (e.g., based on the deserialized version of PCLK). $f_{REF2}$ is frequency and phase locked $f_{REF}$ (i.e., the reference signal output by the reference signal generator 104 of the first radio module 102). For example, $f_{REF2}$ may identical or nearly identical to $f_{REF}$. Some examples of clock recovery schemes that use serializer/deserializer (SerDes) devices are described in U.S. Pat. No. 8,780,939, U.S. Pat. No. 8,368,436, U.S. Pat. No. 6,081,572, U.S. Pat. No. 8,488,657, and U.S. Pat. No. 9,077,348, all of which are incorporated herein by reference. The clock recovery circuit 122 can be configured to implement any such clock recovery scheme, or the like. Generally, a SerDes interface can include any interface where data from a wide bus is combined to generate data for a narrow bus. For example, a SerDes interface can include clocked interfaces (e.g., SPI, I2S, etc.) or systems that utilize embedded clocks and data packets (e.g., Ethernet, JESD204b, etc.). A SerDes interface may also implement synchronization methodology whereby a clock signal, or a coding scheme that realizes and embedded clock, is used to synchronize the tuners. The clock may be an external clock or an integral part of the interface. Examples of SerDes interfaces can include, but are not limited to, serializer/deserializer pairs, High-Definition Multimedia Interface (HDMI) devices, Digital Visual Interface (DVI) devices, Peripheral Component Interconnect Express (PCIe) devices, Inter-IC Sound (I2S) devices, Serial Peripheral Interface (SPI) devices, JESD204b interface devices, Ethernet devices, FDP-link devices, Gigabit Multimedia Serial Link (GMSL) devices, and the like.

The second radio module 118 also includes at least one tuner 124 having a respective antenna 126 communicatively coupled to the tuner 124. In some embodiments, the second radio module 118 further includes at least one additional tuner 128 that can also have respective antenna 130 communicatively coupled to the tuner 128. In some embodiments, two or more tuners (e.g., tuner 124 and tuner 128) can be communicatively coupled to a shared antenna (e.g., a shared multi-band antenna). The tuner(s) (e.g., tuner 124 and/or tuner 128) are communicatively coupled to the clock recovery circuit 122. As described above, the clock recovery circuit 122 is configured to generate $f_{REF2}$ as a reference signal (that is frequency and phase locked to $f_{REF}$) for the tuner 124 and any other tuners (e.g., tuner 128) or other components (e.g., serializer 132) of the second radio module 118. In this manner, multiple radio modules (e.g., radio modules 102 and 118) that are physically separate and/or remotely located from one another can still operate at the same reference frequency and phase. In some embodiments, the tuner 124 is communicatively coupled to the clock recovery circuit 122 via communication link 141 (e.g., one or more wires, traces, etc.) and configured to receive $f_{REF2}$ from the clock recovery circuit 122. The tuner 124 may communicate $f_{REF2}$ to the tuner 128 via a communication link 143 (e.g., one or more wires, traces, etc.). In some embodiments, the communication link 143 is coupled to an output buffer of the tuner 124 that relays $f_{REF2}$ or a buffered version of $f_{REF2}$. The tuners (e.g., tuner 124 and tuner 128) can also be configured to communicate data signals (e.g., broadcast signals) to the serializer 132 via data lines 131 and 133. In some embodiments, tuner 106 has at least two respective data lines 131, and tuner 133 has at least two respective data lines 113. However, in other embodiments, each of the tuners can have one respective data line, or any number of respective data lines.

The communication system 100 can include a baseband processor 138 configured to receive signals from the tuners (e.g., tuner 106, tuner 110, tuner 124, and/or tuner 128). The baseband processor 138 can be configured to perform a diversity reception algorithm utilizing the signals. In embodiments, the baseband processor 138 can include a processor coupled to a memory. The processor may include any number of microprocessors, digital signal processors, micro-controllers, circuitry, field programmable gate array (FPGA) or other processing systems, and resident or external memory for storing data, executable code, and other information accessed or generated by the communication system 100. The processor can execute one or more software programs embodied in a non-transitory computer readable medium that implement techniques described herein. The processor is not limited by the materials from which it is formed or the processing mechanisms employed therein and, as such, can be implemented via semiconductor(s) and/or transistors (e.g., using electronic integrated circuit (IC) components), and so forth.

The memory of the baseband processor 138 can be a tangible, computer-readable storage medium that provides storage functionality to store various data and or program code associated with operation of the communication system 100, such as software programs and/or code segments, or other data to instruct the processor, and possibly other components of the communication system 100, to perform the functionality described herein. Thus, the memory can store data, such as a program of instructions for operating the communication system 100 (including its components), and so forth. It should be noted that while a single memory is described, a wide variety of types and combinations of memory (e.g., tangible, non-transitory memory) can be employed. The memory can be integral with the processor, can comprise stand-alone memory, or can be a combination of both. Some examples of the memory can include removable and/or non-removable memory components, such as random-access memory (RAM), read-only memory (ROM), flash memory (e.g., a secure digital (SD) memory card, a mini-SD memory card, and/or a micro-SD memory card), magnetic memory, optical memory, universal serial bus (USB) memory devices, hard disk memory, external memory, and so forth. In implementations, the memory can include removable integrated circuit card (ICC) memory, such as memory provided by a subscriber identity module (SIM) card, a universal subscriber identity module (USIM) card, a universal integrated circuit card (UICC), and so on.

The baseband processor 138 is in communication with the first radio module 102 and the second radio module 118. The baseband processor 138 may be located remotely (e.g., may be disposed physically separate) from the first radio module 102 and/or the second radio module 118. In some embodiments, the baseband processor 138 can be disposed in a head unit 136 having an enclosure 137 that physically separates some or all of the components of the head unit 136 from the first radio module 102 and the second radio module 118. In other embodiments, the baseband processor 138 can be disposed in one of the radio modules (e.g., in the second radio module 118). It is noted that any number of radio modules can be linked together in the manner shown in FIG. 1, wherein the first radio module 102 includes a reference signal generator 104 and additional radio modules in between the first radio module and the baseband processor 138 each include a clock recovery circuit 122 configured to generate a respective clock signal having the same or substantially same phase and frequency characteristics as the first reference signal that is output by the reference signal generator 104.

In embodiments where the baseband processor 138 is located in a head unit 136 separate from the radio modules 102 and 118 (e.g., as shown in FIG. 1), the second radio module 118 can include a serializer 132 that is configured to serialize signals output by the one or more tuners (e.g., tuners 124 and/or 128) of the second radio module 118. The serializer 132 can also be configured to reserialize signals from the first radio module 118. For example, the serializer 132 may be configured to reserialize the first signal after the first signal has been serialized at the first radio module 102 and deserialized at the second radio module 118. The serializer 132 output can be communicatively coupled to a cable 134 (e.g., a coaxial cable, a twisted pair cable, or the like). In some embodiments, the cable 134 includes a single cable (e.g., a single coaxial cable, a single twisted pair cable, or the like), where the serializer 132 is configured to serialize signals from at least one tuner (e.g., tuner 124 and/or 128) of the second radio module 118, or reserialize signals from at least one tuner (e.g., tuner 106 and/or tuner 110) of the first radio module 102 onto one output (i.e., the serializer 132 output) for transmission via cable 134. The serializer 132 can be configured to transmit serialized versions of signals from at least one tuner of the first radio module 102 and/or at least one tuner of the second radio module 118 to the head unit 136 for further processing (e.g., demodulation and/or diversity reception processing) by the baseband processor 138. For example, the serializer 132 can be configured to transmit the serialized versions of the signals via cable 134. The head unit 136 can include a deserializer 140 configured to receive serialized versions of the signals from the tuner(s). For example the deserializer 140 can be configured to receive the serialized versions of the signals via cable 134. The deserializer 140 can be further configured to deserialize the serialized versions of the signals and transmit deserialized versions of the signals to the baseband processor 138. In an embodiment, the deserializer 140 transmits the deserialized versions of the signals to the baseband processor 138 via communication link 145. For example, communication link 145 can include a plurality of data lines, a PCLK signal line, WS signal line, and so forth.

It is noted that the one or more tuners (e.g., tuner 106 and/or tuner 110) of the first radio module 102 do not need to be active in order to receive signals with the one or more tuners (e.g., tuner 122 and/or tuner 124) of the second radio module 118. Similarly, the tuners of the second radio module 118 do not need to be active to receive signals with the tuners of the first radio module 102. Both of the first radio module 102 and the second radio module 118 may be active when a diversity reception scheme is employed. For example, the baseband processor 138 may be configured to receive similar (e.g., same signal type or frequency band) or different signals from a tuner (e.g., tuner 106 and/or tuner 110) of the first radio module 102 and from a tuner (e.g., tuner 122 and/or tuner 124) of the second radio module 118. The baseband processor 138 may be configured to combine or select from these signals to leverage the different tuner characteristics and/or their respective antenna positions. The baseband processor 138 can be configured to perform a diversity reception algorithm utilizing the signals. For example, in an embodiment, the baseband processor 138 is configured to select a strongest signal (e.g., from among multiple received signals). In another embodiment, the baseband processor 138 is configured to average or combine multiple signals to improve signal performance.

In embodiments, the tuners (tuner 106, tuner 110, tuner 122, and/or tuner 124) are configured to output a digital data stream. In some embodiments, the digital data stream output by a tuner includes a reference signal (e.g., first reference signal or second reference signal) either as a unique signal or combined with other data in the digital data stream. An example format for the digital data stream is an $I^2S$ format, which includes a clock signal, word-frame signal, in-phase data (I-data) components, and quadrature data components (Q-data). The serializer (e.g., serializer 114 or serializer 132) can be configured to use the clock signal as a master clock signal with the other lines used as general inputs. In some embodiments, the serializer (e.g., serializer 114 or serializer 132) is configured to accept multiple lines (e.g., up to 14 or more) such that many tuners can be located in a radio module (e.g., in radio module 102 or radio module 118). In embodiments, the clock signal may be generated by the tuner (e.g., tuner 106) with a fractional relationship to the reference signal generated by the reference signal generator 104. In other embodiments, the clock signal is the same or substantially the same as the reference signal. In other embodiments, the clock signal is based on the reference signal and generated by circuitry between the tuner 106 and the reference signal generator 104.

In some embodiments, the communication system 100 employs power-over-coax to furnish power (e.g., via cables 116 and/or 134) to the serializer/deserializer (SerDes) devices (e.g., serializer 114, deserializer 120, serializer 132, and/or deserializer 140). The communication system 100 may also employ power-over-coax to furnish power to the tuners (e.g., tuner 106, tuner 110, tuner 126, and/or tuner 130). In some embodiments, a control channel within a respective one of the SerDes devices (e.g., serializer 114, deserializer 120, serializer 132, and/or deserializer 140) can be used to program the tuners (e.g., tuner 106, tuner 110, tuner 126, and/or tuner 130) via I²C formatted commands. Employing SerDes devices for communications via cables 116 and 134 can eliminate the need for active antenna buffers (e.g., low-noise amplifiers (LNAs)), separate power cables, and separate control lines. In addition, placing the tuners (e.g., tuner 106, tuner 110, tuner 126, and/or tuner 130) in radio modules (e.g., radio module 102 and/or radio module 118) instead of placing the tuners in the head unit 136 can reduce design complexity by eliminating or reducing the presence of noise sensitive analog signals in the head unit 136. Power dissipation in the head unit 136 may also be reduced when the tuners (e.g., tuner 106, tuner 110, tuner 126, and/or tuner 130) are included in radio modules (e.g., radio module 102 and/or radio module 118) that are separate from the head unit 136.

Example Process

Figure 2:
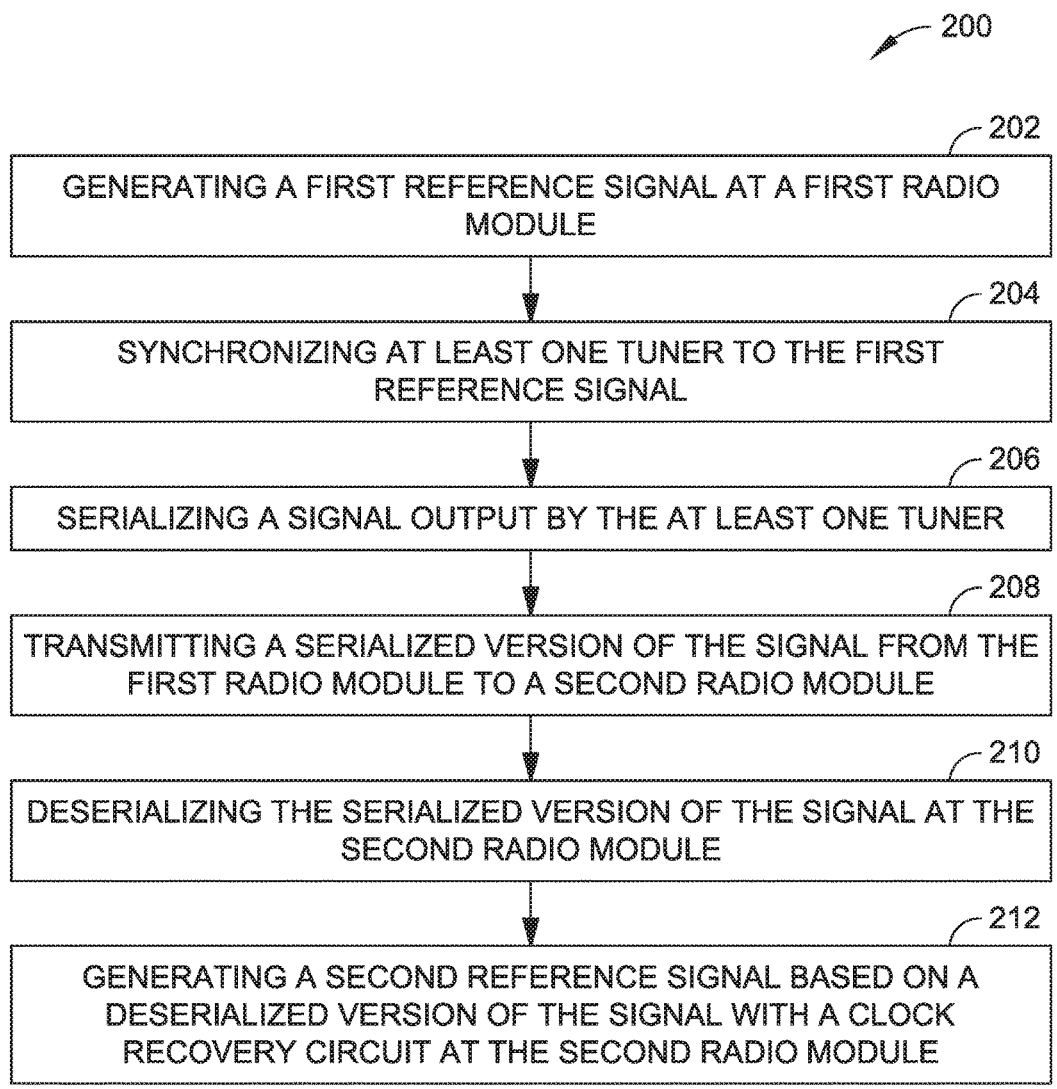
FIG. 2 is a flow diagram illustrating a process for providing a reference signal from a first radio module to a second radio module in a communication system, such as the communication system illustrated in FIG. 1, in accordance with an example implementation of the present disclosure.

FIG. 2 illustrates an example process 200 for providing a reference signal for a second radio module that is physically separate from a first radio module in a communication system that employs a diversity reception scheme, such as the communication system 100 shown in FIG. 1. In general, operations of disclosed processes (e.g., process 200) may be performed in an arbitrary order, unless otherwise provided in the claims.

The process 200 includes generating a first reference signal at a first radio module 102 (block 202). For example, the reference signal generator 104 can generate a first reference signal (e.g., $f_{REF}$) for the tuner 106 and other components (e.g., tuner 110, serializer 114, etc.) of the first radio module 102. At least one tuner (e.g., tuner 106) can be synchronized to the first reference signal (block 204). For example, the tuner 106 can be communicatively coupled to the reference signal generator 104 and configured to receive the first reference signal as an input to the tuner 106. In some implementations, the tuner 106 generates a clock signal (PCLK) for the other components (and possibly for itself) based on the reference signal from the reference signal generator 104. In this regard, the other components can be indirectly synchronized to the first reference signal based on the clock signal.

At least one signal output by a tuner (e.g., tuner 106) of the first radio module 102 is serialized at the first radio module 102 (block 206). For example, the serializer 114 can serialize a signal (e.g., PCLK) output by tuner 106. A serialized version of the signal is then transmitted (e.g., via cable 116) from the first radio module 102 to a second radio module 118 (block 208). In some implementations, several serialized versions of signals from tuners of the first radio module 102 can be transmitted via a single coaxial cable.

The serialized version of the signal is deserialized at the second radio module 118 (block 210). For example, the deserializer 120 of the second radio module 118 can receive the serialized version of the signal (e.g., via cable 116) and can deserialize the serialized version of the signal. A second reference signal (e.g., $f_{REF2}$) is then generated based on a deserialized version of the signal (block 212). For example, the deserializer 120 can transmit the deserialized version of the signal (e.g., PCLK) to the clock recovery circuit 122, and the clock recovery circuit 122 can generate the second reference signal (e.g., $f_{REF2}$) for at least one tuner (e.g., tuner 126 and/or 128) and other components (e.g., serializer 132) of the second radio module 118. In this manner, the second radio module 118 is provided with a reference signal (e.g., $f_{REF2}$) that is frequency and phase locked to the first reference signal generated by the reference signals generator 104 of the first radio module 102.

Generally, any of the functions described herein can be implemented using hardware (e.g., fixed logic circuitry such as integrated circuits), software, firmware, manual processing, or a combination thereof. Thus, the blocks discussed in the above disclosure generally represent hardware (e.g., fixed logic circuitry such as integrated circuits), software, firmware, or a combination thereof. In the instance of a hardware configuration, the various blocks discussed in the above disclosure may be implemented as integrated circuits along with other functionality. Such integrated circuits may include all of the functions of a given block, system, or circuit, or a portion of the functions of the block, system, or circuit. Further, elements of the blocks, systems, or circuits may be implemented across multiple integrated circuits. Such integrated circuits may comprise various integrated circuits, including, but not necessarily limited to: a monolithic integrated circuit, a flip chip integrated circuit, a multichip module integrated circuit, and/or a mixed signal integrated circuit. In the instance of a software implementation, the various blocks discussed in the above disclosure represent executable instructions (e.g., program code) that perform specified tasks when executed on a processor. These executable instructions can be stored in one or more tangible computer readable media. In some such instances, the entire system, block, or circuit may be implemented using its software or firmware equivalent. In other instances, one part of a given system, block, or circuit may be implemented in software or firmware, while other parts are implemented in hardware.

It is to be understood that the present application is defined by the appended claims. Although embodiments of the present application have been illustrated and described herein, it is apparent that various modifications may be made by those skilled in the art without departing from the scope and spirit of this disclosure.

What is claimed is:

1. A communication system, comprising:
   a first radio comprising:
      at least one first tuner,
      a reference signal generator communicatively coupled to the at least one first tuner and configured to generate a first reference signal for the at least one first tuner, and
      a first serializer configured to serialize a first signal output by the at least one first tuner;
   a second radio comprising:
      a first deserializer configured to receive a serialized version of the first signal from the first serializer and deserialize the serialized version of the first signal,
      at least one second tuner,
      a clock recovery circuit communicatively coupled to the at least second tuner and configured to generate a second reference signal for the at least one second tuner based on a deserialized version of the first signal, wherein the second reference signal is frequency and phase locked to the first reference signal, and a second serializer configured to reserialize the first signal and to serialize a second signal output by the at least one second tuner;

a second deserializer configured to receive serialized versions of the first and second signals from the second serializer and deserialize the serialized versions of the first and second signals; and a baseband processor in communication with the first radio and the second radio, communicatively coupled to the second deserializer, and located remotely from at least one of the first radio or the second radio, the baseband processor being configured to receive the deserialized versions of the first and second signals from the second deserializer.

2. The communication system of claim 1, wherein the first radio and the second radio are physically separate from one another.

3. The communication system of claim 1, further including a cable configured to transmit the first signal from the first serializer of the first radio to the first deserializer of the second radio.

4. The communication system of claim 3, wherein the cable comprises a single coaxial cable.

5. The communication system of claim 1, wherein the reference signal generator comprises a crystal oscillator.

6. The communication system of claim 5, wherein the crystal oscillator comprises a temperature compensated crystal oscillator.

7. The communication system of claim 1, wherein the baseband processor and the second deserializer are disposed within a head unit that is physically separate from the first and second radio.

8. The communication system of claim 1, further including a cable configured to transmit the first and second signals from the second serializer to the second deserializer.

9. The communication system of claim 8, wherein the cable comprises a single coaxial cable.

10. The communication system of claim 1, wherein the baseband processor is configured to perform a diversity reception algorithm based on the first signal from the first radio and the second signal from the second radio.

11. The communication system of claim 1, wherein the clock recovery circuit includes a phase locked loop coupled to at least one of a voltage controlled oscillator or a digitally controlled oscillator.

12. The communication system of claim 1, wherein the at least one first tuner comprises a plurality of tuners configured to receive a plurality of broadcast channels, and wherein the first serializer is configured to serialize a plurality of digitized channels from the plurality of tuners onto a single output.

13. The communication system of claim 12, wherein the plurality of broadcast channels include a plurality of different broadcast channels.

14. The communication system of claim 12, wherein the plurality of different broadcast channels include at least one of a terrestrial broadcast channel, a geo-positioning signal, or a satellite broadcast channel.

15. The communication system of claim 12, wherein the plurality of different broadcast channels include at least one of an amplitude modulation (AM) channel, a frequency modulation (FM) channel, a digital audio broadcasting (DAB) channel, a satellite radio channel, a digital television (DTV) broadcasting channel, a satellite television channel, a global navigation satellite system (GNSS) signal, a radio frequency (RF) communication signal, an optical communication signal, a cellular tower signal, or a microwave communication signal.

16. A method of providing a reference signal for a second radio that is physically separate from a first radio, comprising:

generating a first reference signal at the first radio;

synchronizing at least one first tuner to the first reference signal at the first radio;

serializing a first signal output by the at least one first tuner at the first radio;

transmitting a serialized version of the first signal from the first radio to the second radio;

deserializing the serialized version of the first signal at the second radio; and generating a second reference signal based on a deserialized version of the first signal with a clock recovery circuit at the second radio, wherein the second reference signal is frequency and phase locked to the first reference signal;

synchronizing at least one second tuner to the second reference signal at the second radio;

reserializing the first signal; at the second radio;

serializing a second signal output by the at least one second tuner at the second radio;

receiving serialized versions of the first and second signals at a deserializer, the deserializer being communicatively coupled to a baseband processor, the baseband processor being communicatively coupled to first and second radios and located remotely from at least one of the first radio and the second radio;

deserializing the serialized versions first and second signals; and transmitting the deserialized versions of the first and second signals from to the baseband processor.

17. The method of claim 16, further comprising performing a diversity reception algorithm based on the first signal from the first radio and the second signal from the second radio at the baseband processor.

* * * * *